United States Patent
Matsuda et al.

(10) Patent No.: US 7,271,537 B2
(45) Date of Patent: Sep. 18, 2007

(54) DISPLAY DEVICE AND A METHOD OF MANUFACTURING THE DISPLAY DEVICE

(75) Inventors: Eisuke Matsuda, Kanagawa (JP); Reo Asaki, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/279,270

(22) Filed: Apr. 11, 2006

(65) Prior Publication Data

US 2006/0232202 A1 Oct. 19, 2006

(30) Foreign Application Priority Data

Apr. 15, 2005 (JP) ............................ P2005-117717
May 17, 2005 (JP) ............................ P2005-143472

(51) Int. Cl.
  *H01L 51/54* (2006.01)
(52) U.S. Cl. ....................... 313/506; 313/504; 313/513
(58) Field of Classification Search ................. 313/506
  See application file for complete search history.

(56) References Cited

U.S. PATENT DOCUMENTS

| | | | |
|---|---|---|---|
| 6,366,025 B1 | 4/2002 | Yamada | |
| 6,747,618 B2 | 6/2004 | Arnold et al. | |
| 6,872,472 B2 | 3/2005 | Liao et al. | |
| 7,030,553 B2* | 4/2006 | Winters et al. | 313/504 |
| 2003/0189401 A1 | 10/2003 | Kido et al. | |
| 2006/0138945 A1* | 6/2006 | Wolk et al. | 313/506 |

FOREIGN PATENT DOCUMENTS

| | | |
|---|---|---|
| JP | 2001-290441 | 10/2001 |
| JP | 2003-272860 | 9/2003 |
| JP | 2004-39617 | 2/2004 |
| JP | 2004-79538 | 3/2004 |

\* cited by examiner

*Primary Examiner*—David Bruce
*Assistant Examiner*—Conrad R Blease
(74) *Attorney, Agent, or Firm*—Sonnenschein Nath & Rosenthal LLP

(57) ABSTRACT

A display device having a light-emitting element which has a lower electrode, an upper electrode, a functional layer, and a cavity in which light generated in the functional layer is resonated wherein the optical distance of the cavity portion in a first light-emitting element is made equal with the optical distance of the cavity portion in a second light-emitting element, and the optical distance of the cavity portion in the first light-emitting element is different from the optical distance of the cavity portion in a third light-emitting element.

16 Claims, 7 Drawing Sheets

| L (nm) | TAKE-OUT WAVELENGTH (nm) | FIRST STAGE | SECOND STAGE | THIRD STAGE | FOURTH STAGE |
|---|---|---|---|---|---|
| 310 | 460 | 0.43 | 0.93 | 0.14 | 1.00 |
|  | 630 | 0.26 | 0.05 | 1.00 | 0.63 |
| 240 | 530 | 1.00 | 0.18 | 0.71 | 0.82 |

DISPLAY DEVICE AND A METHOD OF MANUFACTURING THE DISPLAY DEVICE

CROSS REFERENCE TO RELATED APPLICATIONS

The present invention contains subject matter related to Japanese Patent Application JP 2005-117717 filed in the Japanese Patent Office on Apr. 15, 2005, and Japanese Patent Application JP 2005-143472 filed in the Japanese Patent Office on May 17, 2005, the entire contents of which being incorporated herein by reference.

BACKGROUND OF THE INVENTION

1. Field of the Invention

The present invention concerns a display device and a method of manufacturing the same and, more particularly, it relates to a self-light emitting display device in which light emitting elements such as organic EL elements are arranged on a substrate, and a method of manufacturing the same.

2. Description of the Related Art

A full color display device using light-emitting elements includes a constitution having a color filter in combination with a white light emitting element. One of the constitutions of the white light-emitting element is that a plurality of light-emitting layers are laminated in one light-emitting unit put between an anode and a cathode and they emit light simultaneously thereby taking-out white light. Further, the white light-emitting element also includes, as another constitution, a tandem structure in which a plurality of light-emitting units are laminated between a cathode and an anode.

However, in a case of laminating a plurality of light-emitting layers in one light-emitting unit, it is extremely difficult to control the light emission balance for RGB in the light-emitting unit. Then, the balance of light emission is controlled by supplying higher a current to a light-emitting element disposed to a display picture element for a color at the lowest light emitting efficiency than the current supplied to other light-emitting elements disposed to display picture elements for colors of good light emitting efficiency. However, this shortens the life of the light-emitting element of the display picture element for the color at the low light emitting efficiency compared with that of other display elements of display picture elements. Accordingly, this results in a difference to the degradation rate between each of the colors to cause off-balance for white color.

In order to solve the problem, it has been proposed to make the light emitting area of a display picture cell for a certain color, among display picture elements for various colors, different from the light-emitting area of the display picture element of other colors, thereby mitigating the off-balance of the white color caused by the difference of the light-emitting efficiency and the degradation rate between each of the self-light emitting elements (refer to JP-A No. 2001-290441).

Further, it has also been proposed a constitution of controlling the light emitting areas for RGB in a tandem type white light-emitting element in which light-emitting units for RGB are laminated by way of a connection layer (refer, for example, to JP-A No. 2004-79538).

SUMMARY OF THE INVENTION

However, in the display device having a resonator structure of resonating a light emitted from a light-emitting layer, since the setting for the optical distance is complicated, it is difficult to adopt the constitution described above.

The present invention has been achieved in view of the foregoings. The display device of the invention concerns a display device having a light-emitting element provided with a functional layer between an upper electrode and a lower electrode, and adapted to take-out a light generated in the functional layer under cavity in a cavity portion, in which a pixel is formed with a set of at least three light-emitting elements corresponding to different wavelength, wherein the optical distance of the cavity portion in a first light-emitting element forming the pixel is made equal with the optical distance of the cavity portion in a second light-emitting element, and the optical distance of the cavity portion in the first light-emitting element is made different from the optical distance of the cavity portion in a third light-emitting element.

The light-emitting unit referred to herein is a unit of layers including, for example, those constituent factors other than a cathode and an anode, that is, a light-emitting layer, an electron injecting layer, an electron transporting layer, a hole injecting layer, and a hole transporting layer, etc. generating light corresponding to a mono-color or multi-colors. The functional layer is a unit of layers further including a connection layer. The light-emitting element means a constitution containing a functional layer, an upper electrode, and a lower electrode.

Further, a method of manufacturing a display device according to an embodiment of the invention is a method of manufacturing a display device having a plurality of light-emitting elements each having functional layers between an upper electrode and a lower electrode and adapted to take-out a light generated in the functional layer under cavity in a cavity portion, wherein a pixel is formed with a set of at least three light-emitting elements corresponding to different wavelengths, in which the optical distance of the cavity portion in a first light-emitting element of the pixel is made equal with the optical distance of the cavity portion in a second light-emitting element of the pixel, and the optical distance of the cavity portion in the first light-emitting element is made different from that of the optical distance of the cavity portion in a third light-emitting element.

According to the invention, since it may suffice that two kinds of optical distance are set, a display device of a resonator structure can be obtained easily and accurately. Further, by the use of the light-emitting unit in common, refinement can be attained for light-emitting elements and a portion between the light-emitting elements to enable highly fine display. In addition, since a light of a desired emission color can be taken out at a sufficient intensity, it is possible for full color display excellent in color reproducibility.

DESCRIPTION OF THE ACCOMPANYING DRAWINGS

Figure 8:
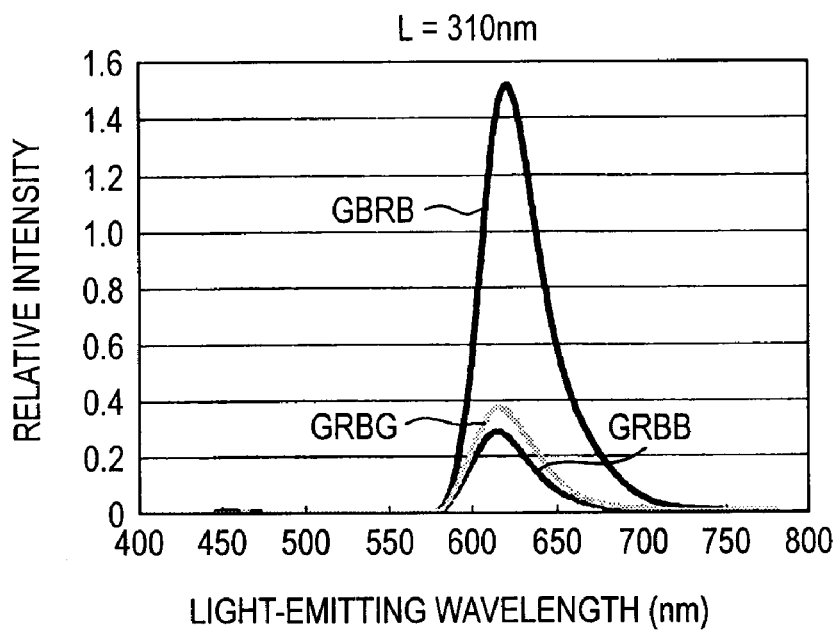
Figure 9:
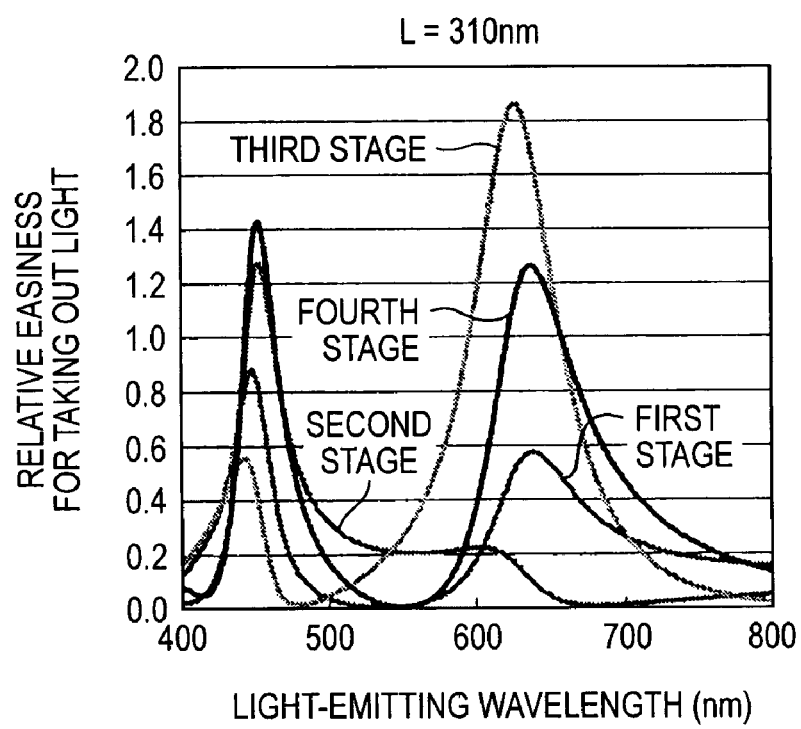
Figures 10, 11:
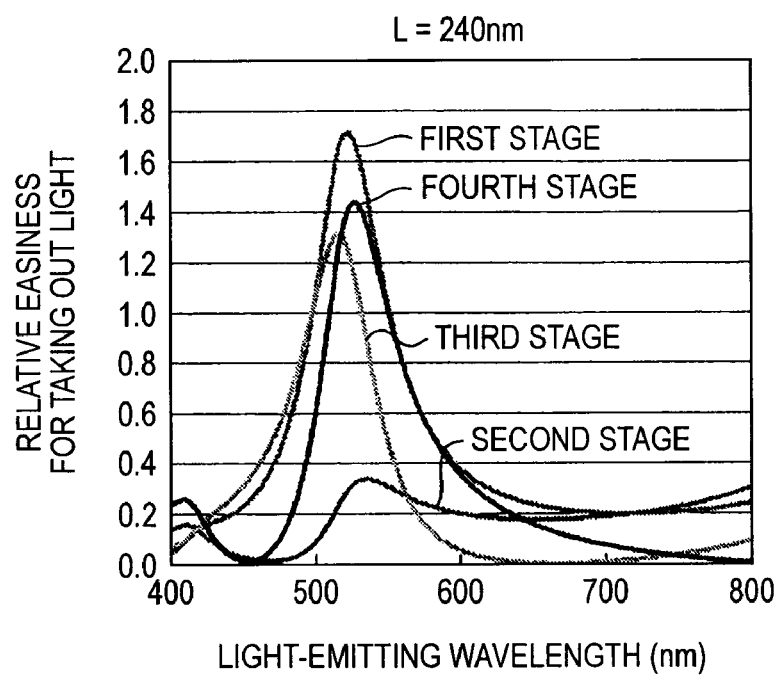

FIG. 8 a graph (3) showing the result of simulation in a case of disposing a color filter for each of colors;

FIG. 9 is a graph (1) showing the intensity of light taken out from each of organic EL elements;

FIG. 10 is a graph (2) showing the intensity of light taken out from each of organic EL elements; and FIG. 11 is a table showing an index for relative easiness of taking-out light based on a case where the taken-out light is at the maximum being assumed as 1 in each of wavelength regions.

DESCRIPTION FOR THE PREFERRED EMBODIMENTS

The present invention is to be described specifically by way of preferred embodiments with reference to the drawings.

Outline of a Display Device

FIG. 1 is a schematic view for explaining an outlined constitution of a display device according to this embodiment. That is, in the display device according to this embodiment, functional layers 10-1, 10-2, and 10-3 are arranged between an upper electrode 3 and a lower electrode 2, and at least three light emitting elements (organic EL elements; EL1, EL2, and EL3) are disposed to a substrate 1 for taking out under cavity lights emitted from the functional layers 10-1, 10-2, and 10-3 with the portion between the upper electrode 3 and the lower electrode 2 being as a cavity portion. At least three organic EL elements EL1, EL2, and EL 3 constitute one pixel. In the examples shown in FIG. 1(a), one pixel is constituted by a first organic EL element 1 corresponding to a first color, a second organic EL element EL 2 corresponding to a second color, and a third organic EL element EL 3 corresponding to a third color.

In this embodiment, as an optical distance for each of the cavity portions of at least three organic EL elements EL1, EL2, and EL3 constituting one pixel, an optical distance of the cavity portion corresponding to the first organic EL element EL 1 is made equal with the optical distance of the cavity portion corresponding to the second organic EL element EL 2, and the optical distance for the cavity portion corresponding to the first organic EL element EL1 is different from the optical distance for the cavity portion corresponding to the third organic EL element EL 3.

For setting the optical distance described above, in the example shown in FIG. 1, a common transparent conductive film 20a is disposed between the functional layer 10-1 and the lower electrode 2 corresponding to the first organic EL element EL 1, and between the functional layer 10-2 and the lower electrode 2 corresponding to the second organic EL element EL 2, and another transparent conductive film 20b of a height different from that of the transparent conductive film 20a is disposed between the functional layer 10-3 corresponding to the third organic EL element EL 3 and the lower electrode 2.

That is, the transparent conductive film is disposed between the functional layer and the lower electrode for setting the optical distance of the cavity portion. In a case of constituting one pixel with three light-emitting elements, the optical distance is set by two transparent conductive films. By setting the optical distance using transparent conductive films by the number less than that of the light emitting elements constituting the pixel, it is possible to decrease the number of manufacturing steps compared with a case of forming transparent conductive films of different heights for each of the light-emitting elements.

Figure 1A:
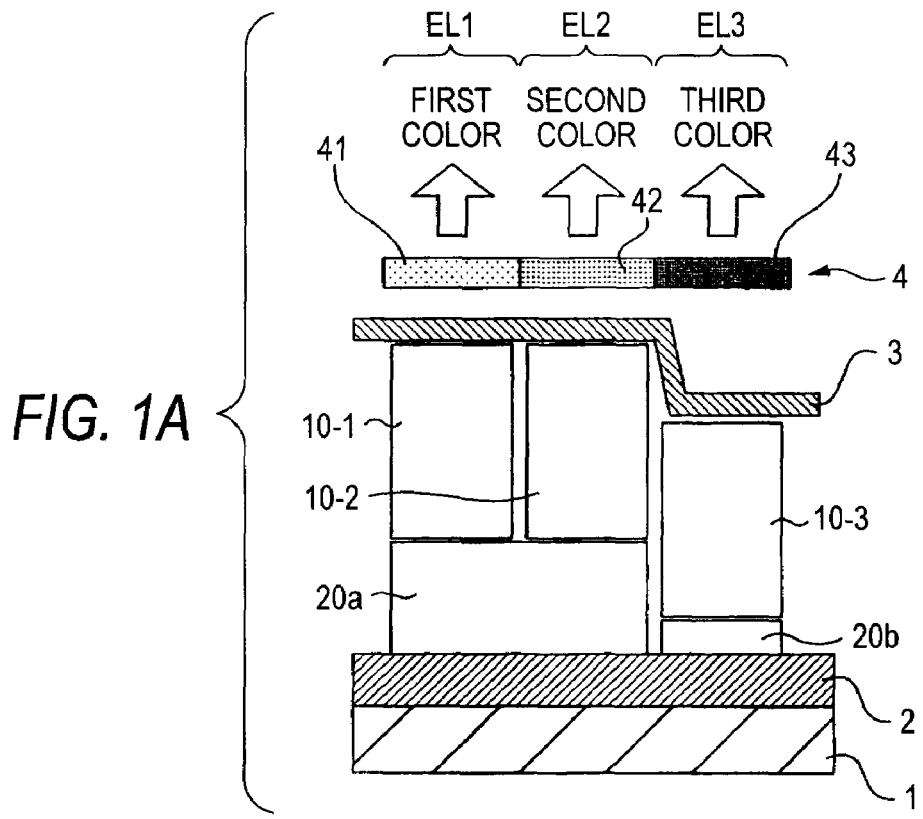
FIG. 1 is a schematic view for explaining the outlined constitution of a display device according to a preferred embodiment.
Figure 1B:
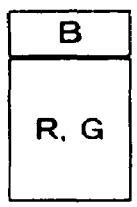

In the example shown in FIG. 1(a), three light-emitting elements (organic EL elements EL1, EL2, and EL3) constitute one pixel. In this case, a full color display device can be obtained by using R (red), B (blue), G (green) as the first color, the second color, and the third color. Further, this is applicable also to a case of forming the pixel by light-emitting elements of more than three colors. In addition to the three colors described above, one or more of cyan, magenta, and yellow may also be added. Particularly, since many colors represented by cyan are present in the natural world, expressive power for colors can be enhanced by adding the cyan color.

As described above in a case of constituting the pixel with more than three light-emitting elements, for example, in a case of forming one pixel with four light-emitting elements, there may be considered a case in which the transparent conductive films include 2 types, that is, a transparent conductive films in common with three light-emitting elements and a transparent conductive film corresponding to the remaining one light-emitting element, 2 types, that is, a transparent conductive film in common with two light-emitting elements and a transparent conductive film in common with the remaining two elements, or three types, that is, a transparent conductive film in common with two light-emitting elements and a transparent conductive film disposed corresponding to the remaining two elements.

In the same manner, it can also correspond to light-emitting elements by the number of 5, 6 - - - . That is, in a case of forming one pixel with light-emitting elements by the number of n (n is an integer of 3 or greater), the characteristic constitution of the invention can be attained by defining type of the transparent conductive film to 2 or more and (n−1) or less.

In the display device shown in FIG. 1(a), while the optical distance in the cavity portion of the organic EL element as a light-emitting element is defined by using the transparent conductive film, the optical distance may also be defined by other factor than the transparent conductive film. For example, the distance may be controlled by the thickness for each of the layers forming the functional layer. Further, the portion corresponding to the transparent conductive films 20a and 20b shown in FIG. 1(a) may also be formed with the lower electrode 2.

Figure 1C:
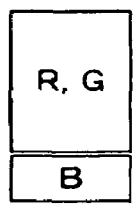
Figure 1D:
Figure 1E:
Figure 1F:
Figure 1G:
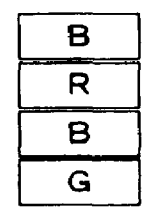

The functional layers 10-1, 10-2, and 10-3 of the organic EL elements EL1, EL2, and El3 as each of the light-emitting elements are formed of various light-emitting units. FIGS. 1(b) to (g) show constitutional examples for the light-emitting unit of each of the functional layers. An example shown in 1(b) is a tandem type in which two light-emitting units are laminated where a lower light-emitting unit emits light for R, G while the upper light-emitting unit emits light for B. Further, the example shown in FIG. 1(c) is a tandem type using two light-emitting units identical with those in FIG. 1(b) where light-emitting unit emitting light for B is laminated below while the unit emitting light for R, G is laminated above. Further, the example shown in FIG. 1(d) is formed with one light-emitting unit which emits a white light. The example shown in FIG. 1(e) is formed with one identical light-emitting unit, which emits a light of a mono-color at a specified wavelength. The example shown in FIG. 1(f) is a tandem type where three light-emitting units are laminated in the order of G, R, and B from blow. Further, the example shown in FIG. 1(g) is a tandem type of laminating four light-emitting units in the order of G, B, R and B from blow.

Constitutions for the functional layers shown in FIGS. 1(b) to (g) are only the example and they may be of any other constitution. For example, the light-emitting unit may also be constituted as that of three or more colors. That is, it may be formed as that of four or more colors by adding one or more of cyan, magenta, and yellow to three colors R, G, and B.

As a specific constitution of this embodiment, a display device having a tandem functional layer of laminating four light-emitting units shown in FIG. 1(g) is to be described.

Specific Constitution of a Display Device

Figure 2:
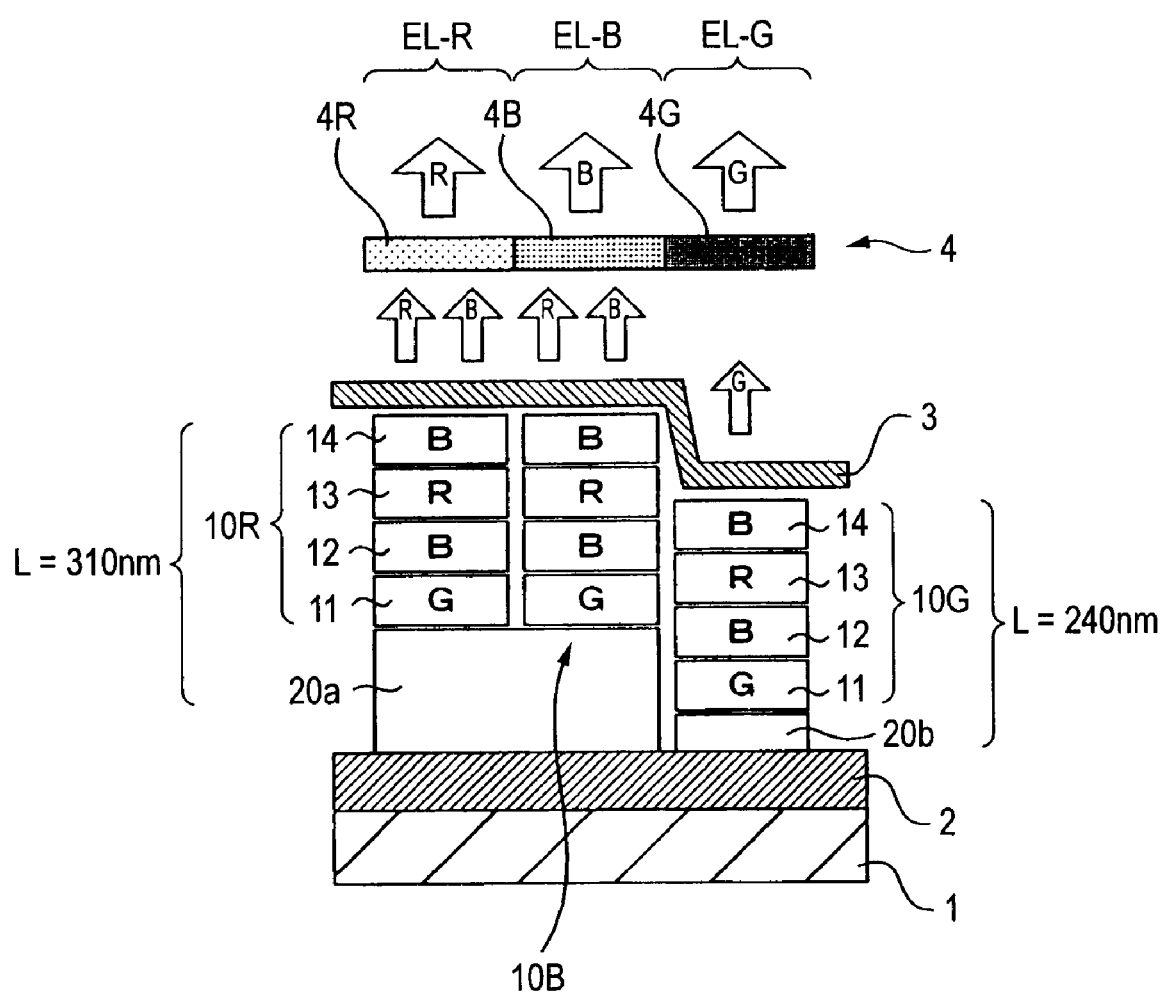
FIG. 2 is a schematic cross sectional view for a constitutional example of a display device according to the preferred embodiment.

FIG. 2 is a cross sectional view schematically showing a constitutional example of a display device according to this embodiment. The display device shown in the drawing is a full color display device in which each of organic EL elements that takes out a light for each of the colors red (R), blue (B), and green (G) is arranged and formed above the substrate 1 as light emitting elements. An organic EL element corresponding to red (R) is referred to as EL-R, an organic EL element corresponding to blue (B) is referred to as EL-B, and an organic EL element corresponding to green (G) is referred to as EL-G.

Each of the organic EL elements EL-R, EL-B, and EL-G has a constitution of laminating a lower electrode 2, a transparent conductive film (transparent layer) 20a, 20b, functional layers 10R, 10B, and 10G, and an upper electrode 3 successively from the side of the substrate 1, and it is constituted as a so-called top emission type of taking out the emitted light of wavelength generated in the functional layers 10R, 10B and 10G from the side of the upper electrode 3 opposed to the substrate 1. Details for each of the members are to be described.

The substrate 1 is formed of glass, silicon, plastics, etc. to which a thin film transistor (TFT) is formed.

The lower electrode 2 disposed on the substrate 1 is formed as a mirror by using a conductive material of excellent light reflectivity. While the lower electrode 2 is usually used as an anode or a cathode, since the functional layers 10R, 10B and 10G are disposed by way of the transparent conductive films 20a and 20b above the lower electrode 2 in this embodiment, the transparent conductive films 20a and 20b form a substantial anode or cathode. Accordingly, the lower electrode 2 may be formed of a material of excellent reflectivity in this embodiment.

The lower electrode 2 is patterned to a shape suitable to the driving system of the display device. For example, in a case where the driving system is a simple matrix type, the lower electrode 2 is formed, for example, into a stripe shape. Further, in a case where the driving system is an active matrix type having TFT on every pixels, the lower electrode 2 is formed as a pattern corresponding to each of pixels arranged in plurality and connected by way of contact holes (not illustrated) with TFT also disposed on every pixels.

The transparent conductive films 20a and 20b are disposed on the lower electrode 2. The transparent conductive films 20a and 20b each comprises, for example, indium tin oxide (ITO).

In the transparent conductive films 20a and 20b, for three organic EL elements EL-R, EL-B, and EL-G, identical transparent conductive film 20a is used for the organic EL elements EL-R and EL-B. That is, the transparent conductive film 20a is patterned such that the optical distance corresponding to R and B is identical (for example, L=310 nm). Further, the transparent conductive film 20b corresponding to the organic EL element EL-G is patterned to an optical distance corresponding to G (for example, L=240 nm). That is, the transparent conductive films 20a, 20b disposed to each of the organic EL elements EL-R, EL-B, and EL-G have two kinds of thickness (optical distance Lt of the transparent conductive film). It is not necessary that the transparent conductive films 20a and 20b are formed of an identical material.

Each of the functional layers 10R, 10B, and 10G has a lamination of plural light-emitting units 11 to 14 that emit lights of different wavelengths. In this embodiment, a first light-emitting unit 11, corresponding to green (G), a second light-emitting unit 12 corresponding to blue (B), a third light-emitting unit 13 corresponding to red (R), and a fourth light-emitting unit 14 corresponding to blue (B) are laminated in this order from the side of the lower electrode 2. In this embodiment, the light-emitting unit corresponding to blue having the lowest light-emitting efficiency generally represented as cd/A (luminosity per unit current) is formed as layers by the number of two which is more than that of light-emitting units of other wavelength.

Figure 3:
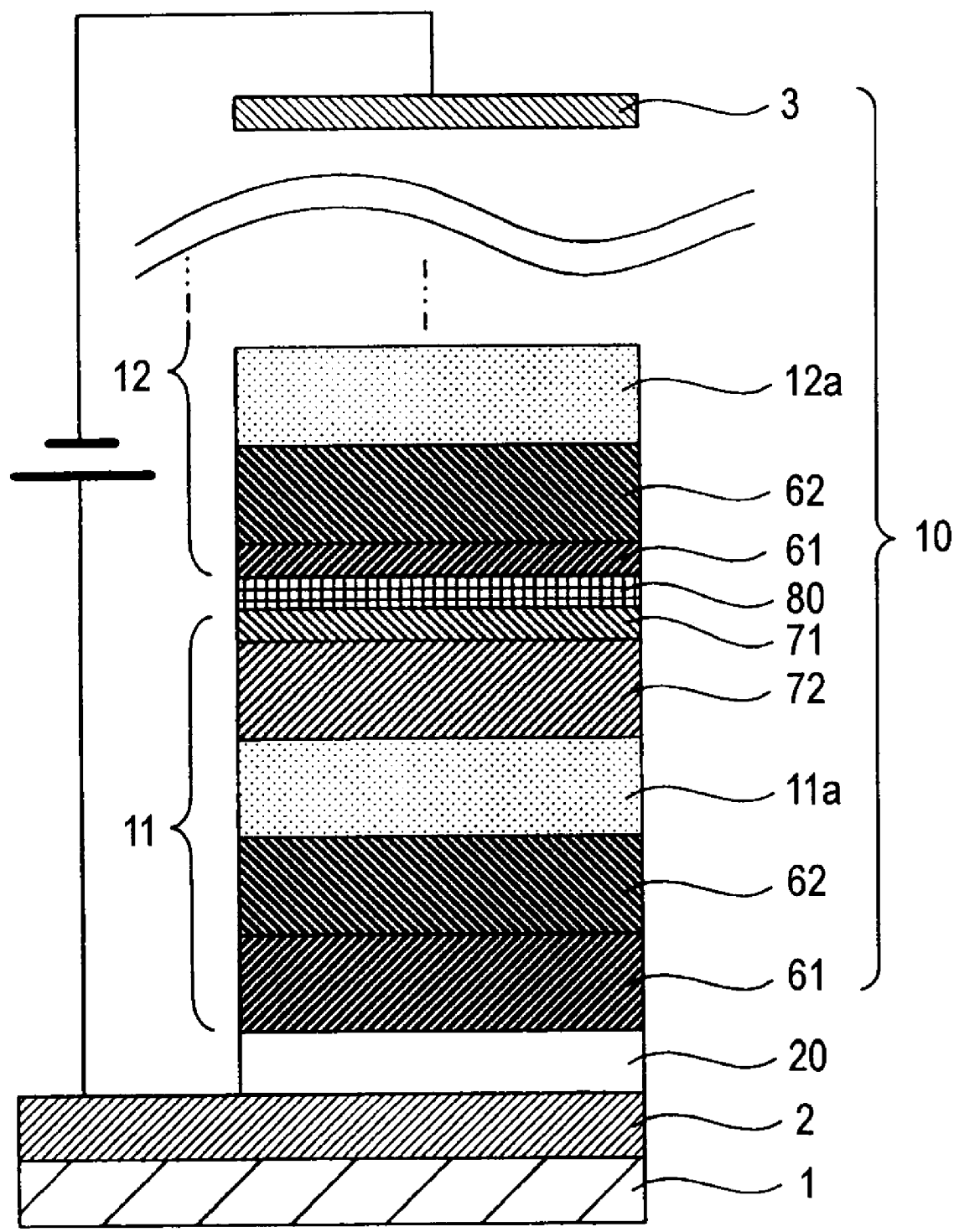
FIG. 3 is a schematic cross sectional view explaining details of functional layers laminated over a transparent conductive film.

FIG. 3 is a schematic cross sectional view for explaining details of the functional layers laminated over the transparent conductive film. In the functional layer 10 (corresponding to each of the functional layers 10R, 10B, and 10G shown in FIG. 2), plural light-emitting units (only 11, 12 are indicated in FIG. 2) are laminated. One light-emitting unit (for example, light-emitting unit 11) has, for example, a hole injecting layer 61, a hole transporting layer 62, a light-emitting layer 11a, a charge transporting layer 72, and a charge injecting layer 71 in this order from the side of the lower electrode 2. Other light-emitting unit 12 and other light-emitting units 13, 14 (refer to FIG. 2) are also formed by repeating the lamination by way of a connection layer 80. The connection layer 80 is a layer for connecting each of the light-emitting units.

While the connection layer 80 has, for example, a charge injecting layer 71, a charge generating layer 80, and a hole injecting layer 61, the charge injecting layer 71 may also serve as a charge generating layer 80, or the hole injecting layer 61 may be saved. The constitution of the charge generating layer 80 is properly selected depending on the characteristics of the electron transporting layer 62 and the hole injecting layer 61.

The upper electrode 3 is formed as a half mirror, and the upper electrode 3, in a case of use as the anode, comprises a conductive material of high work function such as nickel, silver, gold, platinum, palladium, selenium, rhodium, ruthenium, iridium, rhenium, tungsten, molybdenum, chromium, tantalum, niobium, or alloys thereof, or tin oxide ($SnO_2$), indium tin oxide (ITO), zinc oxide, and titanium oxide.

Further, the upper electrode 3, in a case of use as the cathode (in a case of FIG. 2), comprises a conductive material of low work function. For example, it comprises an alloy of metals such as Li, Mg, and Ca and metals such as Ag, Al, and In.

Further, in case where the display device is a simple matrix type, the upper electrode 3 is formed into a stripe shape crossing the strips of the lower electrode 2 and laminate portions formed by crossing of them form organic EL elements. Further, in a case where the display device is an active matrix type, the upper electrode 3 is formed in a state of covering one surface of the substrate 1.

Then, description is to be made for the optical distance L of the cavity portion and the optical distance Lt of the transparent conductive films 20a and 20b.

In each of the organic EL elements, the optical distance L of the cavity portion is set to such a value that the light in a desired wavelength region set to each of the organic EL elements resonates on both ends of the cavity portion, respectively. Accordingly, the optical distance L of the cavity portion is formed in a range substantially satisfying the following equation (1) assuming, for example, the phase shift caused upon reflection of an emitted light generated in the light-emitting units 11 to 14 on both ends of the cavity portion as φ radian, an optical distance of the cavity portion as L, and the peak wavelength in the spectrum of a light intended to be taken out among the emitted light generated in the light-emitting units 11 to 14 as λ.

$$(2L)/\lambda + \phi/(2\pi) = m \quad (m \text{ is an integer}) \ldots \quad (1)$$

In this case, for the functional layer 10B, a peak wavelength (for example, λ=460 nm) is set in a blue light region as the peak wavelength λ in the spectrum of a light intended to be taken out, and the optical distance L of the cavity portions is calculated. Further, for the functional layer 10G, a peak wavelength (for example, λ=530 nm) is set in a green light region as the peak wavelength λ in the spectrum of a light intended to be taken out, and the optical distance L of the cavity portions is calculated. Further, for the functional layer 10R, a peak wavelength (for example, λ=630 nm) is set in a red light region as the peak wavelength λ in the spectrum of a light intended to be taken out, and the optical distance L of the cavity portions is calculated.

It may suffice that the optical distance L of each of the cavity portions is a value satisfying the equation (1).

Then, since each of the functional layers 10R, 10B, and 10G is formed of identical layers containing the light-emitting units 11 to 14, the optical distance L of the cavity portion is controlled by the optical distance Lt of each of the transparent conducting films 20a, and 20b. Accordingly, the optical distance Lt (film thickness) for the transparent conductive films 10a, 20b of each of the functional layers 10R, 10B, and 10G is set so as to satisfy the following equation (2) assuming the optical distance for the transparent conductive films 20a, 20b as Lt and the optical distance for the functional layers 10R, 10B and 10G including the light-emitting units 11 to 14 as Lf:

$$L = Lt + Lf \ldots \quad (2)$$

in which Lf is a constant value smaller than L.

In a case of disposing a color filter 4 in combination with the display device having the constitution as described above, color filters 4R, 4B, and 4G that allow to transmit only the light near the peak wavelength λ in the spectrum intended to take out from each of the functional layers 10R, 10B, and 10G are disposed on the light take-out side of the respective functional layers 10R, 10B and 10G.

Then, since the lights taken out from each of the organic EL elements EL-R, EL-B, and EL-G are taken out under resonance in the cavity portions of the respective organic EL elements EL-R, EL-B, and EL-G, only the lights in the desired wavelength regions corresponding to red, blue, and green are taken out at a sufficient intensity.

In addition, since the entire functional layers 10R, 10B, and 10G including the light-emitting units 11 to 14 are formed of identical layers in each of the organic EL elements as described above, it is not necessary to prepare the functional layers 10R, 10B, and 10G separately on every organic E1 elements EL-R, EL-B, and EL-G.

Then, since the transparent electrode films 20a and 20b are formed each as a pattern by etching using a resist pattern formed by lithography as a mask, the patterning accuracy is more favorable compared with the functional layers 10R, 10B, and 10G requiring pattern formation using a metal mask or pattern formation using an ink jet.

Further, since the light-emitting units 11 to 14 are formed of identical layers, a phenomenon that an operation voltage of an organic EL element of a certain color is specifically higher compared with other colors is not caused and it is not necessary for the design of operation circuit while considering the difference of the operation condition for the organic EL elements of respective colors.

Method of Manufacturing Display Device

Then, a method of manufacturing a display device having the constitution described above is to be explained.

At first, an electrode material film constituting the lower electrode 2 is formed on the substrate 1, and each of transparent conductive films 20a and 20b having the optical distance Lt set on every organic EL elements formed to respective pixel portions is formed as a pattern on the electrode material film. The pattern formation of the transparent conductive films 20a and 20b is conducted for example, as described below in a case where the transparent conductive films 20a and 20b are formed of an identical material.

A first transparent conductive material film is formed at a thickness identical with that of the transparent conductive film 20b with the smallest optical distance Lt to form a first resist pattern in a state covering only the pixel where the functional layer 10G is located. Then, a second transparent conductive material film is formed such that the film thickness is identical with that of the transparent conductive film 20a on the first transparent conductive material film, to form a second resist pattern in a state of covering only the pixels where the functional layers 10R and 10B are located.

Then, the second transparent conductive material film is etched using the second resist pattern as a mask. Successively, when the first resist pattern is exposed, the first transparent conductive material film is etched using the fist resist pattern and the second resist pattern as a mask. Thus, a transparent conductive film 20b having the first transparent conductive film is formed as a pattern below the first resist pattern, and a transparent conductive film 20a having the first transparent conductive film and the second transparent conductive film is formed as a pattern below the second resist pattern.

As described above, after patterning the transparent conductive films 20a and 20b, the electrode material film is further etched by using the first and the second resist patterns as a mask to form a lower electrode 2 as a pattern.

Then, light-emitting units 11 to 14 including the hole transporting layer, the light-emitting layer, and the electron transporting layer are formed successively above the substrate 1, in a state of covering the transparent conductive films 20a and 20b each formed as a pattern and the lower electrode 2 and the functional layers 10R, 10B, and 10G comprising identical layers are collectively formed on every pixels. Finally, by laminating to form the upper electrode 3, a display device is obtained in which the organic EL elements El-R, EL-B, and EL-G are arranged and formed.

In the preferred embodiment, while the constitution of the top emission display device and a manufacturing method thereof have been described, the invention is applicable also to a bottom emission display device.

Further, in the preferred embodiment described above, while the transparent conductive films 20a and 20b are disposed on the lower electrode 2, the transparent conductive films 20a and 20b may also be disposed between the functional layers 10R, 10B, and 10G, and the upper electrode 3. In this case, the lower electrode 2 serves as a substantially anode or cathode, and the transparent electrodes 20a and 20b serve as a substantial cathode or anode in stead of the upper electrode 3. In the embodiment described above, while the transparent conductive films 20a and 20b are formed as a pattern by using the lithography, the pattern may be formed also by using a method of a vapor deposition mask, ink jet, or the like.

Further, in the embodiment described above, the display device having the lower electrode 2 and the upper electrode 3 as the mirror and the half mirror with a portion therebetween as the cavity portion has been explained. However, the display device of the invention is not restricted to such a constitution. That is, it may also be such a constitution of using the lower electrode 2 or the upper electrode 3 as the mirror and any one of layers that form the functional layers 10R, 10B, and 10G as the half mirror in which the optical distance of the cavity portion is controlled by the thickness of the functional layer other than the light-emitting units 11 to 14 put between the mirrors and the half mirror. Further, it may also has a constitution in which the mirror or the half mirror sandwich the light-emitting units 11 to 14 therebetween from the outside of the upper electrode 3 or the lower electrode 2.

EXAMPLE

Then, procedures for manufacturing display devices of concrete examples of the invention and comparative examples relative to the example are to be described, and the results of evaluation for them are to be described subsequently.

Manufacture of a Display Device of Examples

A lower electrode 2 comprising APC (Ag—Pd—Cu) (about 100 nm film thickness) for the anode as the mirror, and transparent conductive films 20a and 20b comprising ITO of each film thickness were formed on a substrate 1 comprising a glass plate as a pattern. Then, regions of the transparent conductive films 20a and 20b other than the light-emitting region of 2 mm×2 mm at the central portion on the surface were covered with an insulative film (not illustrated).

Then, a metal mask having an opening was located above and in the vicinity of the substrate 1 over an exposed portion of the transparent conductive films 20a and 20b forming each of the light-emitting regions. Light-emitting units 11 to 14 were laminated by a vacuum vapor deposition method under a vacuum of $10^{-4}$ Pa in the order of green, blue, red, and blue (hereinafter referred to as GB, RB, - - - ) above the transparent conductive films 20a and 20b and the insulative film, to form functional layers 10R, 10B, and 10G. The film thickness for each of the light-emitting units 11 to 14 was made substantially uniform in a range from 50 nm to 70 nm.

Then, a thin film of Mg and Ag at a co-vapor deposition ratio of 10:1 was formed at a film thickness of 9 nm as the cathode forming the half mirror. Further, ITO was formed to a film thickness of 150 nm, to form an upper electrode 3.

In this example, a value as a minimum in the optical distance L of the cavity portion satisfying the formula (1) above was set such that the intensity of lights of Red: at wavelength $\lambda$=630 nm, Blue: at wavelength $\lambda$=460 nm, and Green: at wavelength 530 nm to be taken out from each of the organic EL elements EL-R, EL-B, and EL-G for R, B and G was sufficiently large. Then, the film thickness for each of the functional layers 10R, 10B and 10G was set to 220 nm and the optical distance Lt for each of the transparent conductive films 20a and 20b is set to: Lt (red)=80 nm, Lt (blue)=80 nm, and Lt (green)=10 nm so as to satisfy the formula (2) above.

Preparation of Display Device of Comparative Example

In the comparative example, the procedures were identical with those in the example except for laminating plural light-emitting units in the order of GRBB, and BRBG.

Result of Evaluation

For the display devices of the example and the comparative example manufactured as described above, the spectrum for the light taken out from each of the organic EL elements was measured.

Figure 4:
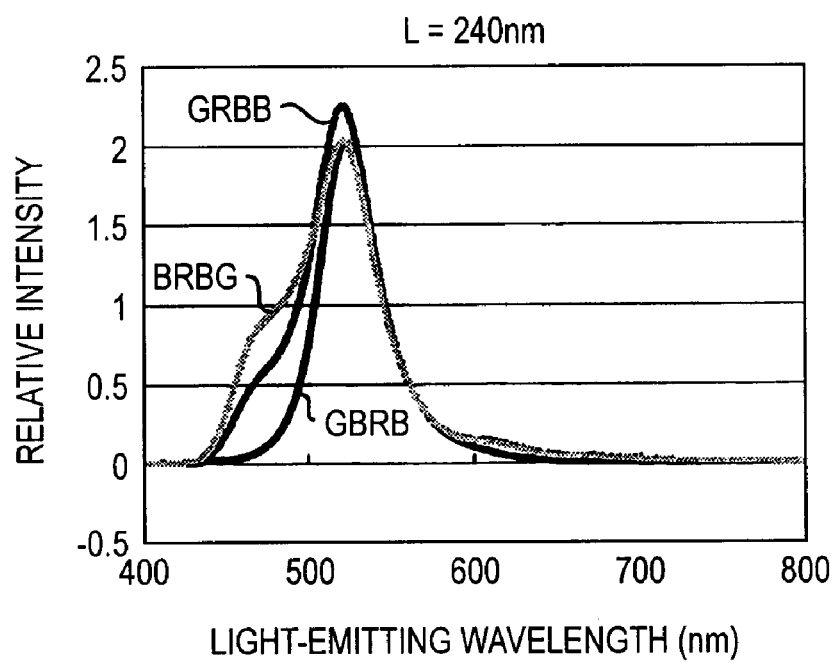
FIG. 4 is a graph showing spectra of a light (L=240 nm) taken out from each of organic EL elements of a display device of an example.
Figure 5:
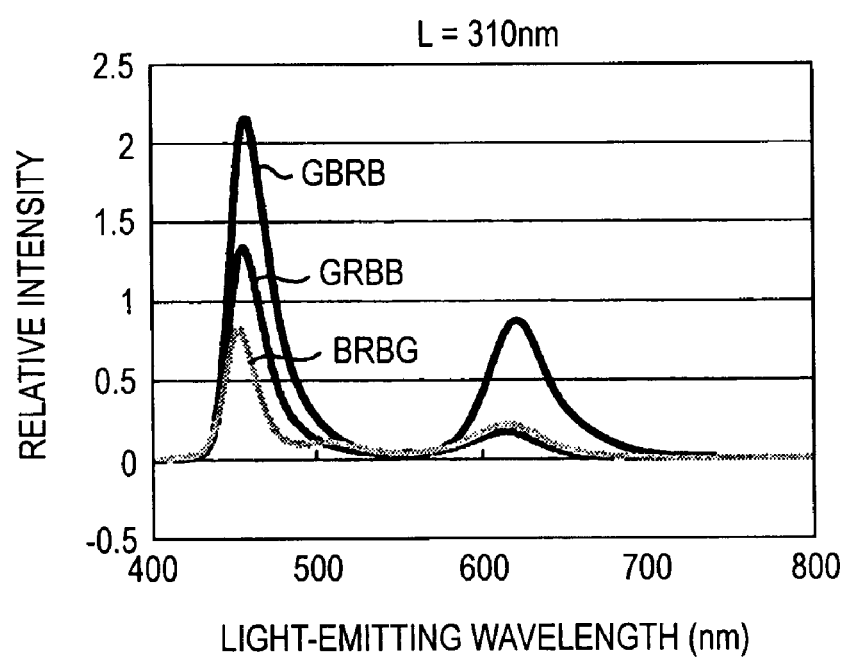
FIG. 5 is a graph showing spectra of a light (L=310 nm) taken out from each of organic EL elements of a display device of an example.

FIG. 4 and FIG. 5 show spectra of lights taken out from each of the organic EL elements of the display device of the examples. FIG. 4 shows a case at L=240 nm in which an emission light at a wavelength in a green region is taken out and FIG. 5 shows a case at L=310 nm in which light emission at a wavelength in blue and red light regions is taken out. In each of the graphs, the ordinate represents a relative intensity in view of the light emission intensity in a case not conducting optical resonance. In view of the graphs, it was confirmed that the light emitting intensity of spectrum was greatly different in the wavelength regions for blue, green, and red and that the light in the wavelength region intended to be taken out from each of the B, G, R organic EL elements was taken out selectively due to the multi-interference effect of light.

In this case, since the optical distance is made identical between blue and red lights, lights for both of the colors were emitted. As can be seen from FIG. 5, it can be seen that a great difference was caused for the light emitting intensity for blue and red although there was no large dependence of the light emitting intensity in the green region in this example.

That is, by laminating the light-emitting units in the functional layer (light-emitting position) in the order of GBRB, the light can be taken out selectively for all red, blue, and green. As described above, since the optical distance is made identical between blue and red, while the light-emitting intensity of red is smaller compared with that of other colors, the light can be sufficiently taken out selectively because it is 50% or more in view of the relative intensity.

Figure 6:
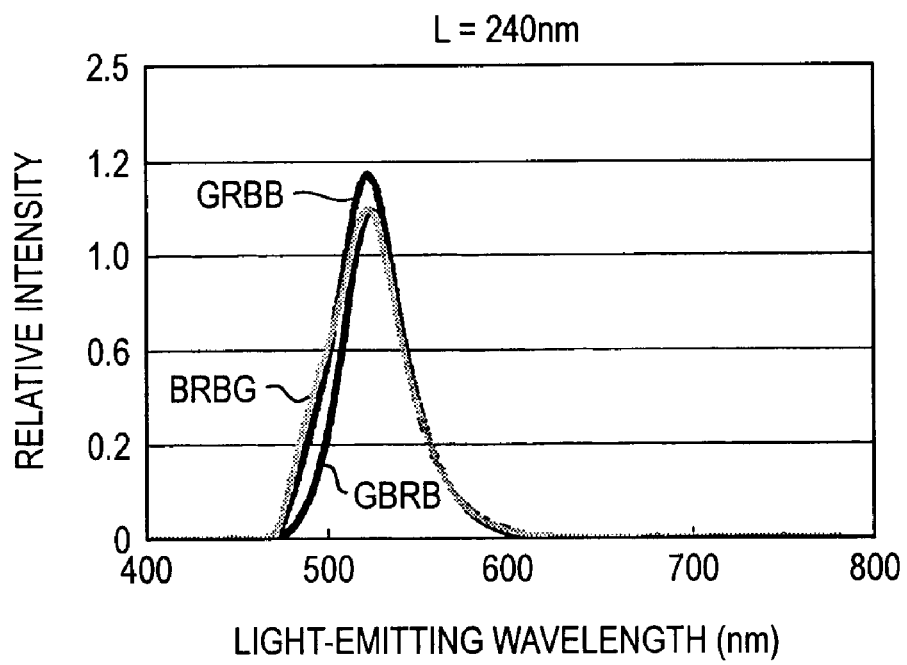
FIG. 6 is a graph (1) showing the result of simulation in a case of disposing a color filter for each of colors.
Figure 7:
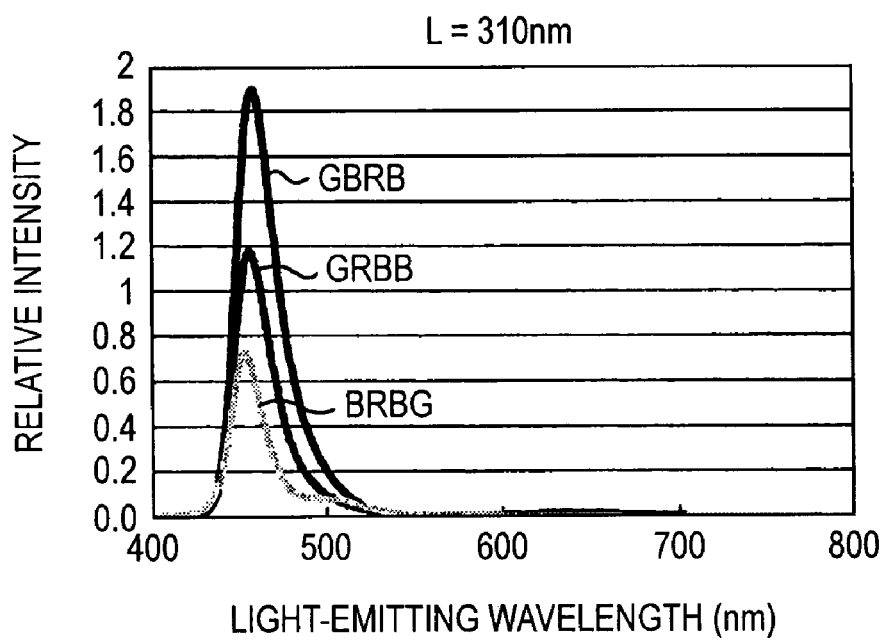
FIG. 7 is a graph (2) showing the result of simulation in a case of disposing a color filter for each of colors.

Then, FIGS. 6, 7, and 8 show the results of simulation in a case of providing color filters for respective colors that allow to permeate only the lights of the wavelength for the respective colors corresponding to each of the G, B, and R organic EL elements on the side of the light-emitting surface in the display device described above. As shown in each of the graphs, it was confirmed that unnecessary wavelength region components in the spectrum of the example are decreased and the color purity of the blue, green, and red lights taken out from each of the B, G, and R organic EL elements was improved by providing the color filters in combination. Further, since the optical distance is identical, it can be seen that pixels emitting blue and red lights can be used as blue or red pixels by the color filter.

On the other hand, FIG. 9 and FIG. 10 are graphs showing the intensity of light taken out from each of the organic EL elements in the display devices of the example and the comparative example. In view of the graphs, it can be seen that there is a great difference for the easiness of taking out the light in view of the order of laminating the light-emitting units in each of wavelength regions. The ordinate in each of the graphs shows the relative easiness of taking out the light, based on the case where optical resonance does not occur being assumed as 1. Further, FIG. 11 shows an index for the relative easiness of taking out the light with the based on the where the taken-out light reaches maximum being assumed as 1. In view of the graph, it can be seen that the light is taken out favorably for three RGB colors which are necessary for full color display by laminating in the order of GBRB.

It should be understood by those skilled in the art that various modifications, combinations, sub-combinations and alterations may occur depending on design requirements and other factors in so far as they are within the scope of the appended claims or equivalents thereof.

What is claimed is:

1. A display device having a light-emitting element, the light-emitting element having a lower electrode, an upper electrode, a functional layer, and a cavity portion in which light generated in the functional layer is resonated, in which a pixel is formed of a set of at least three light-emitting elements corresponding to different wavelength, wherein
the optical distance of the cavity portion in a first light-emitting element is made equal with the optical distance of the cavity portion in a second light-emitting element, and the optical distance of the cavity portion in the first light-emitting element is made different from the optical distance of the cavity portion in a third light-emitting element.

2. A display device according to claim 1, wherein a transparent layer is provided between the functional layer and the lower electrode for controlling the optical distance of the cavity portion, and
the transparent layer in the first light-emitting element and the transparent layer in the second light-emitting element are provided with equal thickness.

3. A display device according to claim 1, wherein the pixel comprises three light-emitting elements corresponding to the wavelength for red, blue, and green.

4. A display device according to claim 1, wherein the functional layer has a plurality of light emitting layers that emit light of different wavelengths.

5. A display device according to claim 1, wherein the functional layer has a plurality of light-emitting units that emit light of different wavelengths.

6. A display device according to claim 5, wherein the plurality of the light-emitting units include a first light-emitting unit having a red color light-emitting layer and a green color light-emitting layer, and a second light-emitting unit having a blue light-emitting layer.

7. A display device according to claim 1, wherein the functional layer has a plurality of light-emitting units that emit lights of different wavelengths, and light-emitting units at a wavelength with the lowest light emitting efficiency represented by cd/A (luminance per unit current) are contained by more than the light-emitting units of other wavelength.

8. A display device according to claim 1, wherein the functional layer has a plurality of light-emitting units that emit lights of different wavelengths, the arrangement of the plurality of light-emitting units is identical in each of the functional layers of each of the light-emitting elements forming the pixel, and the thickness of the light-emitting units in each of the functional layers is substantially equal.

9. A display device according to claim 1, wherein the functional layer comprises a plurality of light-emitting units laminated in the order of a first light-emitting unit corresponding to green, a second light-emitting unit corresponding to blue, a third light-emitting unit corresponding to red, and a fourth light-emitting unit corresponding to blue from the side of the lower electrode.

10. A display device according to claim 1, wherein the first light-emitting element corresponds to the wavelength of red and the second light-emitting element corresponds to the wavelength of blue.

11. A display device according to claim 1, wherein the optical distance L is set within a range satisfying:

$(2L)/\lambda + \phi/(2\pi) = m$ ($m$ is an integer)

in which the phase shift caused upon reflection of a light generated in the functional layer on both ends of the cavity portion is $\phi$ radian, the optical distance of the cavity portion is L, and the peak wavelength in the spectrum of a light intended to be taken out of the cavity portion is $\lambda$.

12. A display device according to claim 1, wherein a transparent layer is provided between the functional layer and the lower electrode for controlling the optical distance L of the cavity portion in the light-emitting device and, in which,
the optical distance Lt of the transparent layer is set so as to satisfy:

$L = Lt + Lf$ where Lt represents the optical distance of the transparent layer and Lf represents the optical distance of the functional layer.

13. A method of manufacturing a display device having a plurality of light-emitting elements each having a functional layer between an upper electrode and a lower electrode, and adapted to take out a light generated in the functional layer under cavity in a cavity portion, wherein
a pixel is formed with a set of at least three light-emitting elements corresponding to different wavelengths, in which
the optical distance of the cavity portion in a first light-emitting element of the pixel is made equal with the optical distance of the cavity portion in a second light-emitting element of the pixel, and
the optical distance of the cavity portion in the first light-emitting element is made different from that of the optical distance of the cavity portion in a third light-emitting element.

14. A method of manufacturing a display device according to claim 13, wherein in a case of forming a transparent layer between the functional layer and the lower electrode for controlling the optical distance of the cavity portion in the light-emitting element, the transparent layer in the first light-emitting element and the transparent layer in the second light-emitting element are formed each at an equal thickness.

15. A method of manufacturing a display device having a pixel comprising three resonance type light-emitting elements corresponding to the wavelengths for red, blue, and green, wherein the method includes the steps of:
forming a lower electrode on a substrate,
forming a transparent layer corresponding to red and a transparent layer corresponding to blue each at an identical height on the lower electrode and forming a transparent layer corresponding to green at a height different from the transparent layers corresponding to red and blue, forming a functional layer by successively laminating a plurality of light emitting units that emit lights at different wavelengths above the transparent layers corresponding to each of red, blue, and green, and forming an upper electrode above the functional layer.

16. A method of manufacturing a display device according to claim 15, wherein the plurality of light-emitting units in the functional layer are laminated in the order of a first light-emitting unit corresponding to green, a second light-emitting unit corresponding to blue, a third light-emitting unit corresponding to red, and a fourth light-emitting unit corresponding to blue from the lower electrode side.

* * * * *